United States Patent [19]

Sakai et al.

[11] Patent Number: 4,929,524
[45] Date of Patent: May 29, 1990

[54] ORGANIC PHOTO CONDUCTIVE MEDIUM

[75] Inventors: Kunihiro Sakai, Yamato; Toshihiko Miyazaki, Atsugi; Ken Eguchi, Atsugi; Haruki Kawada, Atsugi; Yoshinori Tomida, Atsugi; Toshiaki Kimura, Sagamihara; Hiroshi Matsuda, Yokohama; Kiyoshi Takimoto, Atsugi; Kenji Saito, Yokohama, all of Japan

[73] Assignee: Canon Kabushiki Kaisha, Tokyo, Japan

[21] Appl. No.: 99,345

[22] Filed: Sep. 10, 1987

[30] Foreign Application Priority Data

| Sep. 12, 1986 | [JP] | Japan | 61-213973 |
| Sep. 12, 1986 | [JP] | Japan | 61-213974 |
| Sep. 12, 1986 | [JP] | Japan | 61-213975 |
| Sep. 12, 1986 | [JP] | Japan | 61-213976 |
| Sep. 12, 1986 | [JP] | Japan | 61-213977 |

[51] Int. Cl.$^5$ ............................................. G03G 5/06
[52] U.S. Cl. ........................................ 430/56; 430/69
[58] Field of Search .................................. 430/56, 69

[56] References Cited

U.S. PATENT DOCUMENTS

| 2,599,542 | 6/1952 | Carlson | 430/69 |
| 4,512,848 | 4/1985 | Deckman et al. | 156/630 |
| 4,551,406 | 11/1985 | Schaedlich et al. | 430/56 X |
| 4,592,980 | 6/1986 | Tomida et al. | 430/56 X |
| 4,696,884 | 9/1987 | Saitoh et al. | 430/69 X |

FOREIGN PATENT DOCUMENTS

| 266448 | 8/1964 | Australia | 430/69 |
| 0067691 | 12/1982 | European Pat. Off. | |
| 0075454 | 3/1983 | European Pat. Off. | |
| 106540 | 4/1984 | European Pat. Off. | |
| 180222 | 5/1986 | European Pat. Off. | |
| 58-162975 | 9/1983 | Japan | 430/56 |
| 59-58436 | 4/1984 | Japan | 430/69 |
| 60-189753 | 9/1985 | Japan | 430/69 |
| 61-231561 | 10/1986 | Japan | 430/69 |

OTHER PUBLICATIONS

M-Abd-Lefdil et al., "Spray Cd S-Polyacetylene Thin Films Photovoltaic Heterojunctions" (1986), Solar Energy Materials, vol. 3, pp. 307-318.

Merritt, "Organic Photovoltaic Materials: Squarylium and Cyaine-TCNQ Dyes" (1978), IBM J. Res. and Dev., vol. 22, No. 4, pp. 353-371.

Patent Abstracts of Japan, vol. 8, No. 285 (E-287) (1722), Dec. 26, 1984, (JP-A-59 152 673).

Japanese Pat. Abst., vol. 17 (214) (E-199), Sep. 21, 1983, Method for Integrating Macromolecular Semiconductor Field Effect Transistor.

*Primary Examiner*—Roland E. Martin
*Attorney, Agent, or Firm*—Fitzpatrick, Cella, Harper & Scinto

[57] ABSTRACT

There is provided an organic conductive medium, comprising an organic conductive layer formed on the surface of a substrate having fine uneven shape.

58 Claims, 5 Drawing Sheets

ORGANIC PHOTO CONDUCTIVE MEDIUM

BACKGROUND OF THE INVENTION

1. Field of the Invention

This invention relates to an organic conductive medium and an organic photoconductive medium, processes for the preparation thereof and methods for processing them, more particularly to an organic (photo)conductive medium (here, "organic (photo)conductive medium" means "organic conductive medium and organic photoconductive medium", and the prefix "(photo)" is used hereinafter with the same meaning) of which the organic (photo)conductive layer is patterned into high (photo)conductive regions and low- or non-(photo)conductive regions, and also to a process for preparing an organic (photo)conductive medium, which process can provide said organic (photo)conductive medium easily, and a method for processing the same.

2. Related Background Art

Various conductive media such as various IC or semiconductors and various photoconductive media such as photoelectric converting elements, etc. are known in the prior art inorganic material for the most part has been used for the functional portion of these (photo)conductive media. However, as the result of the requirements for higher preciseness, higher fineness, higher integration for these (photo)conductive media, the utility of (photo)conductive organic materials has been widely investigated. Organic materials can be easily handled as the material for the functional portion of semiconductor element, etc. and available in a variety of types.

As one example of conductive organic material, an organic charge transfer complex is known, while as one example of photoconductive organic material, a (photo)conductive organic compound has been known. As the method for forming such (photo)conductive compound as a uniform film on any desired substrate, various methods are known. As one example, the Langmuir-Bloddget method (LB method) proposed by Langmuir et al is known.

According to the LB method, a monomolecular film of a photoconductive organic compound having a hydrophobic site and a hydrophilic site in one molecule or a built-up film thereof can be easily formed on a substrate. The (photo)conductive organic layer thus formed, because hydrophobic sites with high electrically insulating property and the hydrophilic sites with high (photo)conductivity overlap one another in multiple layers in planar shapes, has a peculiar property of anisotropic (photo)conductivity, exhibiting good (photo)conductivity in the horizontal direction of the film, and also having high insulating characteristic in the direction vertical to the film.

The (photo)conductive organic layer as described above has very uniform (photo)conductivity in the planar direction of the layer, and various uses have been demonstrated therefor.

In these organic (photo)conductive media, when used as various electrical elements such as electrical circuits, etc., the (photo)conductive layers is required to be finely processed into desired patterns. As such fine processing method, for example, it may be conceivable to form and grow the (photo)conductive layer as described above into a pattern shape. However, since the LB film as mentioned above is formed by the method in which uniform monomolecular films spread on an aqueous phase are transferred onto a substrate, formation of a film in such pattern shape has not yet been achieved at a practical level.

As another method, it may be conceivable to subject the LB film once formed to patterning by the post-treatment, for example, by etching to remove the desired region of the film. However, this method, as different from chemical etching of an inorganic material, encounters difficulties in selection of the masking material, the masking method, the etchant, etc., posing a problem that the (photo)conductive layer other than the etching region may be denatured. Particularly, as the organic (photo)conductive medium becomes higher in density and integration degree, such fine processing becomes virtually impossible, whereby there is involved the problem that excellent characteristics of the layer comprising the monomolecular film of an organic (photo)conductive compound or a built-up film thereof cannot be fully exhibited.

The LB film as described above has conductivity generally of about 0.1 S/cm and photoconductivity generally of about $10^{-10}$ to $10^{-14}$ S/cm, which are generally very high values for an organic material but are remarkably smaller as compared with gold, silver, copper, etc. which are inorganic conductive materials of the prior art, thus posing the problem that it is insufficient also in aspect of (photo)conductivity.

Accordingly, is been desirable to have a technique for forming a highly precise and fine pattern easily on an organic (photo)conductive medium having the functional portion comprising a (photo)conductive organic material as described above, without impairing the characteristics of these layers.

Also, the photoconductive layer exhibits low wavelength dependency on a photosensitive wavelength, posing the problem that broad photosensitivity is exhibited to a specific wavelength.

Therefore, it has been desirable to have a technique for enhancing photoconductivity and wavelength dependency of the organic photoconductive medium having the functional portion comprising a photoconductive organic material as described above, without impairing the characteristics of these layers.

Also, in case, respective external electrodes required are formed in various electrical elements as mentioned above, when the functional portion of an electrical element is an inorganic material, such electrodes can be readily formed on their surfaces since most of these inorganic materials have conductivity in all the directions, namely they are isotropic materials. However, in the case of an electrical element in which the monomolecular film of an organic charge transfer complex as mentioned above or built-up film thereof is the conductive layer, since these conductive layers have insulting layers and conductive layers overlapping one another in the vertical direction, by only formation of a conductive region for electrodes on the surface, it is difficult to form an Ohmic or Schottky junction due to the presence of the insulating layer forming the layers, whereby no effective external electrode can be formed.

For example, for formation of external electrodes, it is necessary to destroy or peel off the desired portion of the monomolecular film or built-up film thereof in the perpendicular direction and fill a conductor therein. According to such method, since the layer is an organic material and also has a very fine structure, it is very difficult to form accurately the monomolecular film or built-up film thereof. Therefore, the parameters, such as interelectrode distance and electrode area to be formed, influencing greatly the electrical characteristics cannot be controlled with good precision, thereby ensuing the problem that no electrical element of uniform quality can be formed. Particularly, as the electrical element becomes higher in density and integration degree, fine processing can be done with more difficulty, whereby there is the problem that excellent characteristics of the layer comprising a monomolecular film of an organic charge transfer complex or built-up film thereof cannot be fully exhibited.

Accordingly, it has been desirable to have a method for forming easily highly precise and fine external electrodes on the electrical element having the functional portion comprising a conductive organic material as described above, without impairing the characteristics of these layers.

SUMMARY OF THE INVENTION

The present inventors have intensively studied in order to address the shortcomings of the prior art as described above, and consequently developed a technique capable of patterning organic conductive layers into higher conductivity regions and low- or non-conductive regions of a desired pattern without impairing preciseness of a conductive layer comprising a (photo)conductive organic material and without impairing its characteristics at all, and a technique which can remarkably enhance photoconductivity and wavelength dependency.

More specifically, the present invention provides firstly an organic conductive medium, comprising an organic conductive layer formed on the surface of a substrate having a fine uneven shape, and secondly a process for producing an organic conductive medium, comprising laminating a monomolecular film of a conductive organic compound or a built-up film thereof on the surface of a substrate having a fine uneven shape.

The present invention provides thirdly an organic photoconductive medium, comprising an organic photoconductive layer formed on the surface of a substrate having a fine uneven shape, and secondly a process for producing an organic photoconductive medium, comprising laminating a monomolecular film of a photoconductive organic compound or a built-up film thereof on the surface of a substrate having a fine uneven shape.

The fifth embodiment is a method for processing of an organic conductive layer, which comprises injecting or diffusing an impurity which lowers or extinguishes conductivity into the desired site in the conductive layer of the electrical element having an organic conductive layer.

The sixth embodiment is a method for processing of an organic conductive layer, which comprises injecting or diffusing a conductive impurity into the desired site in the conductive layer of the electrical element having an organic conductive layer.

Also, according to the sixth embodiment, by injection of a conductive impurity, patterning can be effected with increase of conductivity at the desired site, and additionally it becomes possible to form external electrodes easily without impairing preciseness of the conductive layer comprising a conductive material or without impairing its characteristics.

DETAILED DESCRIPTION OF THE PREFERRED EMBODIMENTS

Figure 1:
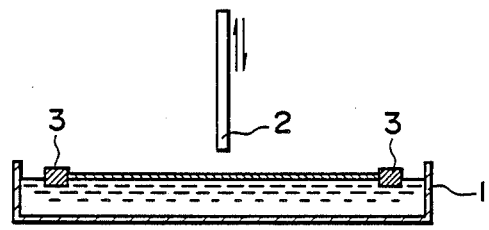
FIG. 1 illustrates diagramatically the method for forming the organic (photo)conductive layer of the (photo)conductive medium of the present invention.

More specifically, according to the detailed study by the present inventors, when an organic (photo)conductive layer is formed of a (photo)conductive organic compound on a substrate with a smooth surface, substantially uniform conductivity was exhibited in the direction parallel to the organic (photo)conductive layer. In contrast, by previously forming a fine uneven shape on the substrate surface and forming an organic (photo)conductive layer on its surface, the (photo)conductivity and the wavelength dependency of the organic (photo)conductive layer formed thereon along the uneven shape on the substrate was remarkably improved or lowered to be patterned into higher (photo)conductivity regions and lower (photo)conductivity regions. Such remarkable change in (photo)conductivity may be considered to be due to remarkable improvement of orientation of molecules constituting the layer when an organic (photo)conductive layer is transferred onto a fine uneven surface along the uneven shape, or due to occurrence of local flow of the layer or rearrangement of the film constituting molecules corresponding to the uneven shape, etc., whereby (photo)conductivity of the film is changed.

Therefore, according to the present invention, provided that a desired uneven shape is imparted to the substrate, by forming thereafter merely an organic (photo)conductive layer, an organic (photo)conductive medium can be provided to solve various drawbacks in the prior art, namely the problems such as many cumbersome steps, use of harsh conditions of high temperature and high pressure, use of various chemical reagents, etc., whereby organic (photo)conductive medium with high density, high integration degree, etc. can be provided by very simple steps.

Also, there is provided an organic (photo)conductive medium having high photoconductivity and excellent wavelength dependency, to solve various drawbacks in the prior art.

Further, the fine uneven shape formed on or imparted to the substrate can give better results, if it is continuous or macroscopically continuous (e.g. continuity of broken line) with a certain directionality.

According to the present invention, provided that such fine uneven shape having any desired directionality is imparted to the substrate, by forming thereafter merely an organic (photo)conductive layer on its surface, an organic (photo)conductive medium having a desired (photo)conductive pattern can be provided.

As the conductive organic compound which forms the organic conductive layer of the organic conductive medium of the present invention, any of the conductive organic compounds known in the art can be used, but particularly preferable conductive compounds are organic charge-transfer complexes.

A preferably charge transfer complex to be used for formation of the organic conductive layer in the present invention is a compound having a hydrophilic site, a hydrophobic site and a conductive site in one molecule.

All of charge transfer complexes (known in the art) meeting such conditions can be preferably used in the present invention; particularly preferable compounds are charge transfer complexes in which the hydrophobic site is a quaternary ammonium group, the hydrophilic site is a hydrophobic hydrocarbon group such as alkyl, aryl, alkyl aryl groups, etc., and the conductive site is tetracyanoquinodimethane structure.

Preferable compounds as the above charge transfer complexes are represented by the following formula (I):

$$[A][TCNQ]_n X_m \quad (I).$$

For example, the following compounds may be included:

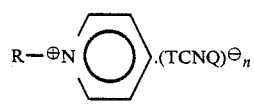
(1)

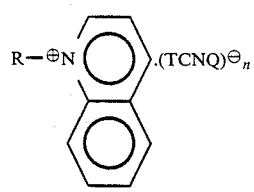
(2)

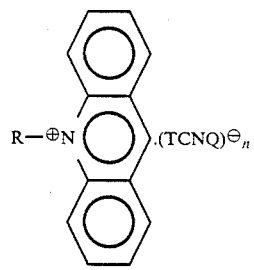
(3)

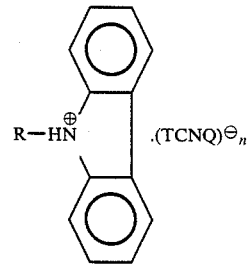
(4)

(5)

-continued

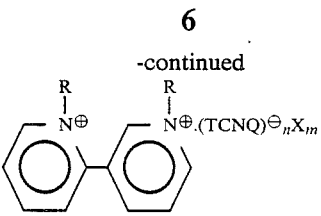
(6)

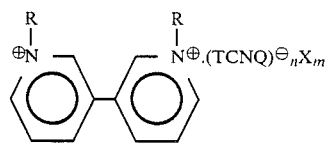
(7)

(8)

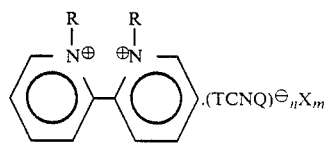
(9)

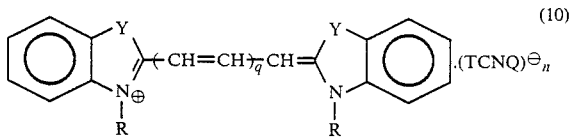
(10)

$$R-\overset{\oplus}{N}(R_1)_3 \cdot (TCNQ)^{\ominus}_n \quad (11)$$

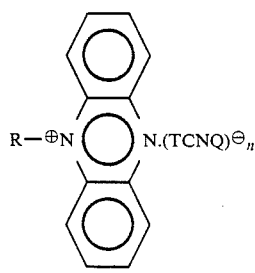
(12)

R in the above formulae is the hydrophobic site, which may be an alkyl, aryl or alkylaryl group, preferably an alkyl group having 5 to 30 carbon atoms. $R_1$ is a lower alkyl group, n and q are 0, 1 or 2, m is 0 or 1, and X is an anion group such as halogen ions (e.g. bromine ion, etc.) or perchlorate ion. Y is oxygen or sulfur.

The compounds as described above may further have polymerizable groups such as double bond, triple bond, etc. in the alkyl group, and can also have one or more substituents such as alkyl, alkenyl, cyano, alkoxy groups, or halogen on the heterocyclic group.

TNCQ is a compound represented by the following formula:

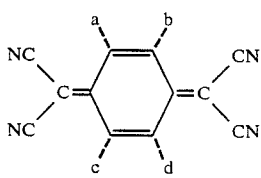

The compound can have any desired substituent such as alkyl, alkenyl groups, halogen atoms, etc. at the positions a–d in the above formula.

The present inventor have intensively studied about charge transfer complexes including the compounds as exemplified above, and found that these charge transfer complexes can be easily formed according to the known method as monomolecular film or a built-up film thereof on a substrate with any desired surface shape, and also that such monomolecular film or a built-up film thereof, when formed on a substrate with a smooth surface, while having high insulating property in the direction vertical to the film and high conductivity in the direction horizontal to the film to exhibit very excellent anisotropic conductivity, cannot be used as such for organic conductive medium in electrical circuit, etc., but when the above substrate has a surface with fine uneven shape, conductivity in the direction horizontal to the film of these organic conductive layers will remarkably vary to exhibit difference in conductivity corresponding to the uneven shape of the substrate, and consequently it is useful for various electrical elements.

As the photoconductive organic compound which forms the photoconductive layer of the organic photoconductive medium of the present invention, any of photoconductive organic compounds known in the art may be used; a preferable photoconductive organic compound is a dye compound having a hydrophilic site, a hydrophobic site and a dye site in one molecule.

All of the organic dye compounds meeting such conditions can be preferably used in the present invention. Also, the molecular rearrangement during film formation as mentioned above may be considered to be greatly dependent on the intermolecular force at this time, and thus the molecule suitable for the present invention should have relatively greater molecular weight. Dye molecules have ordinarily molecular weights of 500 or more, satisfying this condition. Practically, most dyes have been known to be influenced mutually by each other at certain concentrations or higher to form an associated state, and all of the molecules of the organic dyes (known in the art) having not only a hydrophilic site but also a hydrophobic site can be used preferably in the present invention. Examples of such preferable dyes are not limited to cyanine dyes, merocyanine dyes, phthalocyanine dyes, triphenylmethane dyes, azulene dyes, etc. Biological materials such as dye proteins, for example, chlorophile, rhodamine, cytochrome, etc. are also usable.

In the present invention, a preferable method for forming a (photo)conductive layer on the surface of a substrate having any desired fine uneven shape or a substrate having a fine uneven shape having any desired directionality with the proviso of the use of the above (photo)conductive organic compound is the LB method as described below.

The LB method is a method in which a monomolecular film or a built-up film thereof is prepared by utilizing the phenomenon that, in a molecule with a structure having a hydrophilic site and a hydrophobic site in the molecule as in the above (photo)conductive organic compound, when the balance between the both (amphiphilic balance) is adequately maintained, the molecules form a monomolecular layer on the surface with the hydrophilic groups thereof being directed downward.

The monomolecular layer on the water surface has the characteristics of the two-dimensional system. When the molecules are scattered sparsely, the following formula of the two-dimensional ideal gas is valid between the area per one molecule and the surface pressure $\pi$:

$$\pi A = KT,$$

thus becoming "gas film". Here K is the Botzmann's constant and T is an absolute temperature. When A is made sufficiently small, intermolecular interations are strengthened, whereby the molecules become "condensed film (or solid film)" of a two-dimensional solid. The condensed films can be transferred one layer by one layer onto the surface of any desired body of various materials having various shapes such as glass or resin.

As a concrete preparation process, for example, the method as described below may be used.

A desired photoconductive organic compound is dissolved in a solvent such as chloroform, acetonitrile, etc. Next, by use of a suitable apparatus as shown in FIG. 1, the solution of the photoconductive organic compound is spread in a film shape on aqueous phase 1.

Figure 2A:
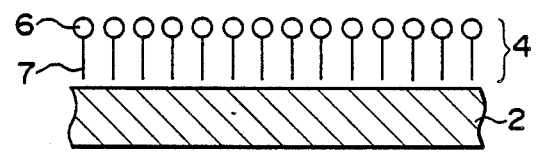
FIGS. 2a and 2b illustrate schematically a monomolecular film.

Then, the partitioning plate (or buoy) 3 is provided to avoid too broad expansion of the spreading layer through free diffusion on the aqueous phase, whereby the spreading area is restricted to control the gathered state of the film substance and obtain the surface pressure $\pi$ in proportion to the gathered state. The gathered state of the film substance is controlled by reducing the spreading area by moving the partitioning plate 3, whereby the surface pressure can be gradually elevated to be set at a surface pressure suitable for preparation of the film. While this surface pressure is maintained, by allowing clean substrate 2 to gently ascend or descend vertically, the monomolecular film of a photoconductive organic compound is transferred onto the substrate 2. Such monomolecular film is a film in which moleculars are orderly arranged as schematically shown in FIG. 2a or FIG. 2b.

The monomolecular film of a photoconductive organic compound can be prepared as described above, and a built-up film with any desired built-up number can be formed by repeating the above operation. For transer of the monomolecular film of a photoconductive organic compound, other than the above vertical dipping method, such methods as the horizontal lifting method, the rotating cylinder method, etc. may be employed.

The horizontal lifting method is a method in which transfer is effected by contacting the substrate horizontally with the water surface, and the rotating cylinder method is a method in which the monomolecular film is transferred onto the substrate by rotating a cylindrical substrate on the water surface.

Figure 2B:
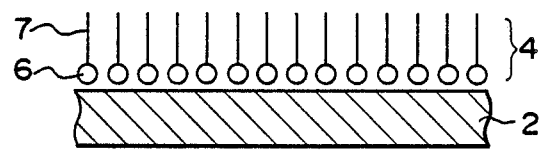

In the vertical dipping method as described above, when a substrate having a hydrophilic surface is withdrawn in the direction transversing the water surface, a monomolecular film with the hydrophilic group of the photoconductive organic compound faced toward the substrate side is formed on the substrate (FIG. 2b). When the substrate is vertically moved up and down as mentioned above, monomolecular films are laminated one sheet by one sheet in each stroke to form a built-up film. In this method, since the direction of the film forming molecules in the withdrawing step becomes opposite to that of the dipping step, there is formed a Y type film in which a hydrophobic group and a hydrophilic group of the photoconductive organic compound are faced to each other between the respective layers (FIG.

Figure 3A:
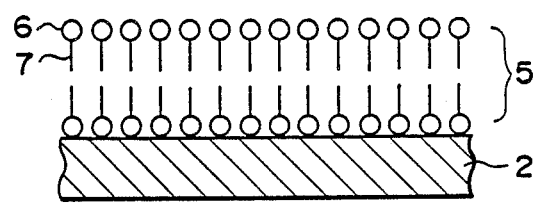
FIGS. 3a to 3c illustrate schematically a built-up film.
Figure 3B:
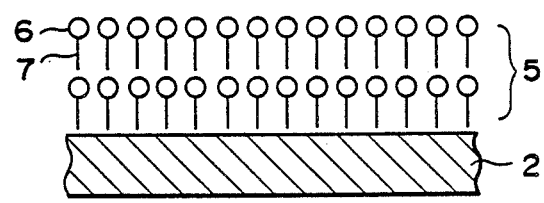
Figure 3C:
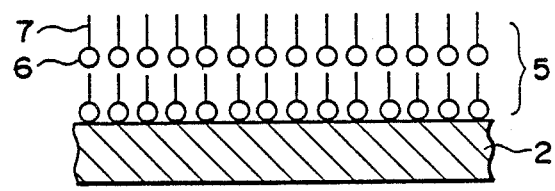
Figure 4:
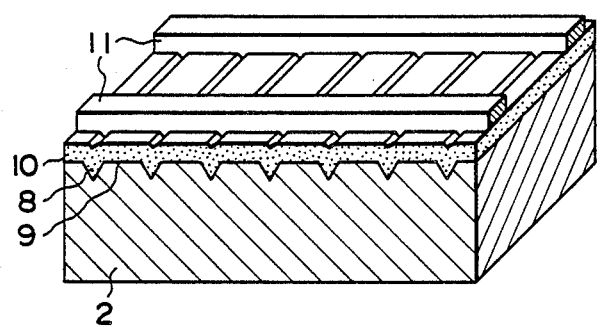
FIG. 4 illustrates diagramatically a sectional view of the (photo)conductive medium of the present invention.

3a). In contrast, according to the horizontal lifting method, a monomolecular film with the hydrophobic group of the photoconductive organic compound being faced to the substrate side is formed on the substrate (FIG. 2a). In this method, even when a film is built up, there is no change in direction of the film-forming molecules. Therefore, there is formed an X type film in which the hydrophobic groups are faced toward the substrate side in all of the layers (FIG. 3b). On the contrary, a built-up film in which the hydrophilic groups in all the layers are faced toward the substrate side is called a Z type film (FIG. 3c).

The method for transferring monomolecular films onto a substrate is not limited to the above methods. It is also possible to employ a method in which a substrate is extruded into an aqueous phase from a roll, when employing a large area substrate. Also, the direction of the hydrophilic group and the hydrophobic group toward the substrate as described above are given as general rules, and it can be also modified by the surface treatment of the substrate, etc.

As described above, the (photo)conductive layer comprising a monomolecular film of the above (photo)-conductive organic compound or a built-up film thereof can be formed.

In the present invention, the substrate for forming a (photo)conductive organic layer comprising a monomolecular film of a (photo)conductive organic compound or a built-up film thereof may be any material of metals, glasses, ceramics, plastic materials, etc. In addition, a biological material which is remarkably low in heat resistance can be also used. The reason why a conductive material such as metal can be used, is that, as described above, the monomolecular film or the built-up film thereof has sufficient insulating characteristic in the direction vertical to the film.

The substrate as described above may have any desired shape, preferably a flat plate shape, but it is not limited to flat plate shape at all. This is because, in the present invention, there is the advantage that the film can be formed according to its shape irrespectively of what shape may be possessed by the surface of the substrate.

The substrate as described above has a fine uneven shape of any desired shape on at least a part of the surface, and such uneven shape can be formed according to any of the methods known in the art. For example, when the substrate is made of a synthetic resin, there may be employed the method using a mold having a desired fine uneven shape surface to transfer its uneven shape; when the substrate is a metal or a ceramic, there may be employed the photoetching method conventionally used in the printing plate technique or the IC technique of the prior art, or any other method such as the method in which a photosensitive resin layer is formed on the desired surface of the above substrate or other substrates and the resin is subjected to exposure and development, to form a uneven shape due to the thickness of the photosensitive resin layer, etc. Also, the uneven shape may take any shape. For example, in the case of an uneven shape having continuity such as straight line shape or curved line shape or combination thereof, photoconductivity, etc. are improved along its shape, while in the case of a random uneven shape without directionality, improvement of photoconductivity, etc. uniform over the whole surface without directionality can be accomplished.

More preferably, the uneven shape formed is continuous and has directionality, as in the case of straight line shape, curved line shape or combination thereof.

If these uneven shapes are too fine or too coarse, the desired effect of the present invention can be insufficiently accomplished, and therefore the interval between those unevennesses, namely the pitch width may be suitably about 0.1 to 100 $\mu$m.

Also, the shapes of the recess and the projection, namely the valley and the mountain, of the uneven shape as described above, are not particularly limited. However, if their difference in height, namely the depth of the recess is too shallow, improvement of photoconductivity or wavelength dependency as described above will be lowered, and therefore a depth of about 0.1 to 100 $\mu$m is preferable.

The (photo)conductive medium of the present invention is provided by forming a (photo)conductive organic layer on a substrate surface having the uneven shape as described above according to the method as described above, and when the (photo)conductive organic compound employed has polymerizable groups, these films can be cured by polymerization after formation of the film as described above to remarkably improve the film strength.

Further, the organic conductive medium of the present invention as described above, as the result of patterning of its conductive layer into higher conductive regions and nonconductive regions, a metal such as gold, silver, copper, nickel, etc. can be plated on its surface with the use of the organic conductive medium as the cathode to form a plated layer corresponding to the conductive pattern, and by doing so, tolerable electrical capacity and heat resistance can also be remarkably improved.

According to the present invention, only by using a substrate having any desired uneven shape as a substrate for a (photo)conductive medium, an organic (photo)-conductive medium having remarkably improved (photo)conductivity and an photoconductive medium having wavelength dependency can be provided without particularly using high temperature, pressure, strong chemical reagents such as acid, alkali, organic solvent.

Figure 5:
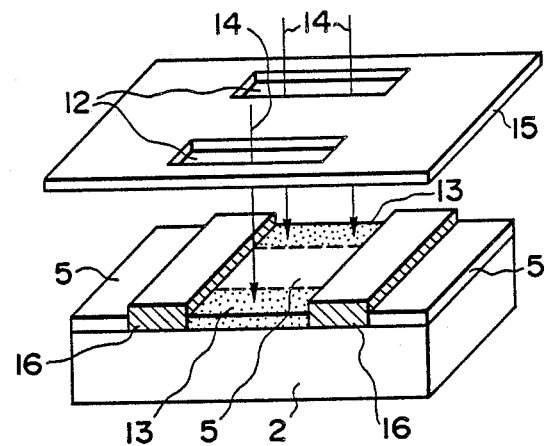
FIG. 5 and FIG. 6 illustrate diagramatically the method for processing the electrical element of the present invention.

Further, the preferable method for finely processing the organic conductive layer formed on the substrate is the method in which, as shown in FIG. 5, the low- or non-conductive region 13 is formed by injecting or diffusing an impurity 14, which lowers or extinguishes conductivity, through the desired pattern mask 15 into the desired region 13 of the organic conductive layer on the substrate 2, namely the built-up film 5 of monomolecular film of an organic charge transfer complex. As the impurity employed, nonconductive materials with good diffusibility are preferable. For example, hydrogen, helium, nitrogen, oxygen, fluorine, neon, argon, etc. are useful, more preferably argon, neon, oxygen and fluorine. As the method for injecting or diffusing these impurities into the organic conductive layer, various methods may be employed. The ion injection method may be suitably used.

The ion injection method is a method in which a desired element is ionized in vacuum, ions are electrostatically accelerated until reaching necessary energy to be implanted into a target (objective material), having the specific features that an impurity which cannot be injected by the thermal diffusion method, etc. can be also injected, and additionally that it is suitable for fine processing.

Such method is sufficiently established as a semiconductor preparation technique, its reliability is high with handling of the device being easy and also productivity is high. The process itself can be performed at room temperature, and it can be considered as one of extremely suitable methods for organic materials.

As the injected ion, for example, all of the examples of impurity as previously mentioned above are applicable, and among them, an inert gas such as argon, etc. is easily handleable and also gives a great effect. On the contrary, an active species such as oxygen or fluorine is also preferable in the point that it can directly react with the film forming molecules to lower greatly conductivity.

The methods as exemplified above are represent active methods, and any of the methods which can exhibit the same effect as above can be utilized in the present invention.

In the following, the method for injecting or diffusing an impurity for increasing conductivity into a desired region as the fine processing of the organic conductive layer, and further the method for forming electrodes on the organic conductive layer according to said method are to be described.

Figure 7A:
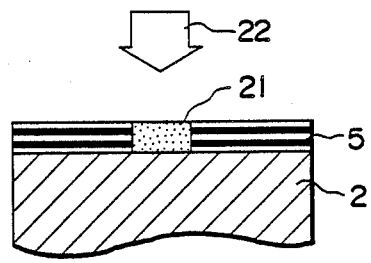
FIGS. 7a and 7b illustrate diagramatically the preparation steps of the electrical element of the present invention.
Figure 7B:
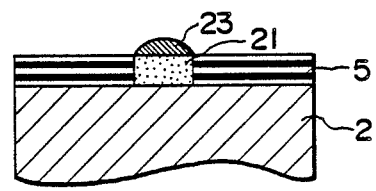

The method for forming electrodes on the organic conductive layer formed on the substrate is a method, in which, as shown in FIG. 7, the conductive region 21 is formed by injecting or diffusing a conductive impurity into the desired region 21 of the organic conductive layer on the substrate 2, namely the built-up film 5 of monomolecular film of an organic charge transfer complex. As the conductive impurity to be used, conductive materials with good diffusibility are preferable. For example, metals such as gold, silver, copper, aluminum, chromium, nickel, etc., conductive oxides of various metals, etc. are useful, and as the method for injecting or diffusing these conductive impurities into the organic conductive layer, various methods may be employed. However, suitable methods may include the vacuum vapor deposition method of metals and the metal ion injection method.

In the vapor deposition method, for example, it is preferable to effect vapor deposition of a metal as mentioned above under the state where the distance between the vaporization source and the substrate is made relatively closer to each other. By vapor deposition under such situation, the metal atoms heated during vaporization can reach the substrate while maintaining high temperature to be injected even to the inner portion of the organic conductive layer 5 and form a conductive region in the organic conductive layer 5, namely electrodes 21. Another vapor deposition method is to diffuse the metal of the metal vapor deposited layer 23 by heat treatment of the metal 23 vapor deposited as described above under the condition which does not impair the organic conductive layer, for example, at relatively lower temperature under vacuum, thereby diffusing the metal into the organic conductive layer 5. According to this method, conductivity between the electrodes in the case of vapor deposition under the state where the distance from the vaporization source is made relatively closer in the above method can be further improved, while in the case when the vapor deposited layer 23 is formed with a distance apart therefrom, in place of substantially no conductivity between the electrodes, high conductivity becomes to be exhibited.

The ion injection method is as described above.

Also, according to the present invention, since no organic (photo)conductive layer on the substrate is required to be destroyed, any desired (photo)conductive pattern can be formed without giving any bad influence to the organic (photo)conductive layer, and therefore highly fine processing is possible, whereby an organic (photo)conductive medium having excellent electrical characteristics can be provided easily.

From the above points, according to the present invention, the organic (photo)conductive medium of the present invention can be expected greatly as a high density electrical element as in the prior art, as a matter of course, and also as an element for bioelectronics.

The present invention is described in detail below by referring to Examples.

EXAMPLE 1

On an i-type crystalline silicon wafer, the photoresist material OMR (produced by Tokyo Oka Kogyo) was coated and dried to a film thickness of 1.5 μm.

Next, after exposure through a photomask, the coating was subjected to developing and subsequently etching treatment to form stripe-shaped grooves (groove width, 16 μm; depth, 1.5 μm; interval between groove and groove, 5 μm).

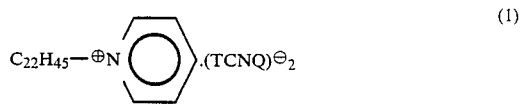
(1)

The above charge transfer complex (1) was dissolved in a solvent mixture of benzene-acetonitrile (volume ratio 1:1) at a concentration of 1 mg/ml, and then spread over an aqueous phase adjusted to pH 6.8 with $KHCO_3$, with a $CdCl_2$ concentration of $4 \times 10^{-4}$ mol/liter and an aqueous phase temperature of 17° C.

After evaporation of the solvents of acetonitrile and benzene, the surface pressure was enhanced to 20 dyne/cm to form a monomolecular film. While maintaining the surface pressure constant, the above silicon wafer was dipped in the direction transversing the water surface gently at a speed of 3 mm/min. and then drawn up gently at a speed of 3 mm/min. to have two layers of the monomolecular film built up on the surface of the substrate. The above built-up operation was again repeated to obtain an organic conductive medium having 4 layers of the monomolecular film laminated on the substrate.

The organic conductive medium of the present invention thus obtained was provided with electrodes, and then conductivity between the two points on a continuous groove was measured to be about $10^2$ S/cm. On the other hand, conductivity between independent points was $10^{-5}$ S/cm or less at any point, thus exhibiting extremely great anisotropic of conductivity.

EXAMPLES 2-9

Various organic media of the present invention were prepared in the same manner as in Example 1 except for changing the groove width (μm) of the stripe-shaped uneven grooves in Example 1 and the built-up number of monomolecular films as shown below in Table 1, and the conductivity between the two points along the groove and conductivity between the two points across the groove were measured to give the results shown below in Table 1.

TABLE 1

| Example | Width(μm) | Built-up number | Conductivity A | Conductivity B |
|---|---|---|---|---|
| 2 | 0.5 | 10 | $4 \times 10^1$ | $2 \times 10^{-5}$ |
| 3 | 1 | 10 | $7 \times 10^1$ | $8 \times 10^{-6}$ |
| 4 | 2 | 100 | $8 \times 10^1$ | $1 \times 10^{-5}$ |
| 5 | 10 | 20 | $5 \times 10^1$ | $1 \times 10^{-5}$ |
| 6 | 50 | 4 | $2 \times 10^1$ | $3 \times 10^{-5}$ |
| 7 | 100 | 10 | 8 | $5 \times 10^{-5}$ |
| 8 | 200 | 10 | 2 | $1 \times 10^{-4}$ |
| 9 | 500 | 10 | 0.1 | $1 \times 10^{-4}$ |

A conductivity (S/cm) between two points along groove
B conductivity (S/cm) between two points across groove

EXAMPLES 10-12

Except for using the charge transfer complex shown below in Table 2 in place of the charge transfer complex in Example 1, various organic conductive media of the present invention were obtained according to the same procedure as in Example 1. Conductivities in different directions of these organic conductive media were measured to obtain the results shown below in Table 2.

TABLE 2

| Example | Charge transfer complex | Conductivity A | Conductivity B |
|---|---|---|---|
| 10 | (2) | $4 \times 10^{-1}$ | $1 \times 10^{-6}$ |
| 11 | (3) | $2 \times 10^2$ | $1 \times 10^{-1}$ |
| 12 | (4) | $5 \times 10^{-1}$ | $1 \times 10^{-6}$ |

A conductivity (S/cm) between two points along groove
B conductivity (S/cm) between two points across groove The above charge transfer complexes have the following structures:

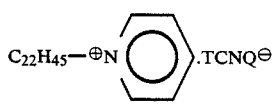

(2)

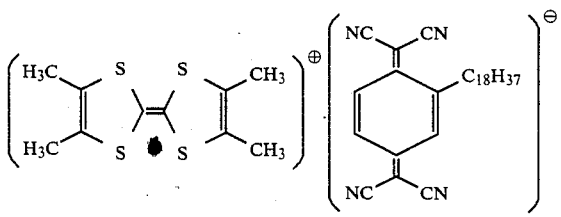

(3)

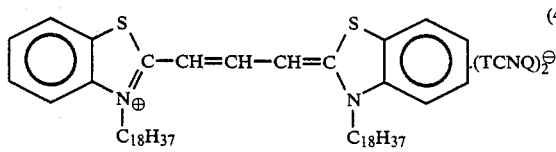

(4)

EXAMPLE 13

With the use of the organic conductive layer of the organic conductive medium of the present invention obtained in Example 1 as the cathode, electrolytic copper plating was conducted in an aqueous copper sulfate (copper sulfate 200 g/liter, sulfuric acid 50 g/liter) under the conditions of a temperature of 20° to 30° C. and a cathode current density of 0.5-1.5 A/dm² to form a plated layer with a thickness of 3 μm along the groove to obtain an organic conductive medium of the present invention.

The conductivity between the two points along the groove of this organic conductive medium was $10^4$ S/cm, while the conductivity between the two points across the groove was $10^{-2}$ S/cm.

COMPARATIVE EXAMPLE 1

Except for using a substrate having a smooth surface in Example 1, a conductive medium was obtained in the same manner as in Example 1. Conductivity between any desired two points on this conductive medium was all about $10^3$ S/cm irrespectively of its direction.

EXAMPLE 14

On a glass substrate, the photoresist material OMR (produced by Tokyo Oka Kogyo) was coated and dried to a film thickness of 2.0 μm.

Next, after exposure through a photomask having 6 kinds of shadow portions of line widths, development was performed to form 6 kinds of regions with respectively different widths on the substrate. These 6 kinds of regions had grooves with widths of 0.5, 1, 5, 20, 100 and 500 μm, and also have the same intervals as the widths of the grooves. On the whole surface of this substrate, hydrophobic treatment was applied by building up 3 layers of the monomolecular film of cadmium arachidinate according to the LB method.

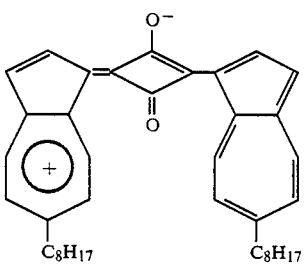

(5)

The above azulene dye (5) was dissolved in benzene at a concentration of 1 mg/ml, and then spread on an aqueous phase, adjusted to pH 6.8 with KHCO₃ with a CdCl₂ concentration of $4 \times 10^{-4}$ mol/liter and an aqueous phase temperature of 17° C.

After evaporation of benzene (solvent), the surface pressure was enhanced to 20 mN/m to form a monomolecular film. While the surface pressure is maintained at a constant level (20 mN/m), the above substrate was dipped in the direction transversing the water surface gently at a speed of 3 mm/min., and then drawn up gently at a speed of 3 mm/min. to form two layers of the monomolecular film on the surface of the substrate. The above built-up operation was repeated 5 times to obtain an organic photoconductive medium of the present invention having 10 layers of the monomolecular film laminated on the substrate.

Further, in the 6 regions of the substrate (with respectively different groove widths), electrodes confronting in the groove direction were formed in 2-3 pairs by use of silver paste according to the known method.

For the sample obtained as described above, photoconductivity $\sigma p$ was measured under irradiation of a ray (500–900 nm) monochromatized by a spectroscope, to obtain the result that it had the maximum in the vicinity of 850 nm in the region with the groove width of 0.5 to 20 μm, with its value being around $10^{-10}$ S/cm. In the region of groove width 100 μm, it was about $5 \times 10^{-11}$ S/cm, and $10^{-11}$ S/cm or less in the region of 500 μm.

COMPARATIVE EXAMPLE 2

In the example by use of a smooth glass substrate according entirely the same method as in the above Example 14, the wavelength dependency was relatively broad, and also σp at 850 nm was about $2 \times 10^{-12}$ S/cm.

Thus, according to the present invention, it has been made clear that the photoconductivity and the wavelength dependency of the photoconductive layer are remarkably improved by the influence of the shape of the substrate surface.

EXAMPLES 15-19, COMPARATIVE EXAMPLES 3-7

Except for setting the built-up number of the monomolecular film in Example 14 as shown below in Table 3, various organic photoconductive media of the present invention and comparative examples were prepared in the same manner as in Example 14 and Comparative example 2, and conductivities were measured in the same manner as in Example 14 to obtain the results shown below in Table 3.

TABLE 3

| Example | Built-up number | Photoconductivity A | B | C |
|---|---|---|---|---|
| 15 | 2 | $3 \times 10^{-11}$ | $2 \times 10^{-11}$ | $8 \times 10^{-12}$ |
| 16 | 20 | $1.5 \times 10^{-10}$ | $1 \times 10^{-10}$ | $1.2 \times 10^{-11}$ |
| 17 | 50 | $2 \times 10^{-10}$ | $1 \times 10^{-10}$ | $2 \times 10^{-11}$ |
| 18 | 100 | $4 \times 10^{-10}$ | $2 \times 10^{-10}$ | $3 \times 10^{-11}$ |
| 19 | 200 | $6 \times 10^{-10}$ | $5 \times 10^{-10}$ | $5 \times 10^{-11}$ |

| Comparative example | Built-up number | Photoconductivity |
|---|---|---|
| 3 | 2 | $8 \times 10^{-13}$ |
| 4 | 20 | $2 \times 10^{-12}$ |
| 5 | 50 | $2 \times 10^{-12}$ |
| 6 | 100 | $3 \times 10^{-12}$ |
| 7 | 200 | $5 \times 10^{-12}$ |

A conductivity (S/cm) of the region with groove width 0.5–20 μm
B conductivity (S/cm) of the region with groove width 100 μm
C conductivity (S/cm) of the region with groove width 500 μm

EXAMPLES 20-24

By use of the dyes shown below in Table 4 in place of the dye in Example 14, following otherwise the same procedure as in Example 14, various organic photoconductive media of the present invention were obtained. The conductivities of the respective different regions of these organic conductive media were measured similarly as in Example 14 to obtain the results as shown below in Table 4. In Examples 21, 22, 23, 24, for improvement of film-forming property, a mixture of arachidinic acid mixed at 1:3 relative to the dye molecule was used as the film constituting material. Further, in Example 24, a mixture of the dyes 9 and 10 at a molar ratio of 1:1 was used.

TABLE 4

| Example | Dye | Photoconductivity A | B | C |
|---|---|---|---|---|
| 20 | (6) | $1 \times 10^{-10}$ | $6 \times 10^{-11}$ | $1 \times 10^{-11}$ |
| 21 | (7) | $3 \times 10^{-9}$ | $1 \times 10^{-9}$ | $8 \times 10^{-10}$ |
| 22 | (8) | $5 \times 10^{-11}$ | $2 \times 10^{-11}$ | $6 \times 10^{-12}$ |
| 23 | (9) | $1 \times 10^{-11}$ | $8 \times 10^{-12}$ | $4 \times 10^{-12}$ |
| 24 | (9) + (10) | $2 \times 10^{-11}$ | $1 \times 10^{-11}$ | $7 \times 10^{-12}$ |

A, B, C have the same meanings as in Table 3.

(6) Porphyrin derivative:

R: pyridinium ring with $N^{\oplus}$—$C_{20}H_{41}$·$Br^{\ominus}$ (7) Phthalocyanine derivative:

R: $OC_5H_{11}$
M: Cu (8) Merocyanine type dye derivative:

$C_{18}H_{37}$, $CH_2COOH$ (9) Cyanine type dye derivative:

$C_{18}H_{37}$, $C_{18}H_{37}$, $Br^{\ominus}$

(10) Azobenzene derivative:

$O_2N$—⟨⟩—N=N—⟨⟩—N(CH$_3$)$_2$ with COOH-bearing chain

EXAMPLE 25

By use of a polycarbonate substrate having V-shaped grooves (30 grooves/mm) with width of 1.6 μm and depth of 0.8 μm as the substrate, 20 layers of the monomolecular film were built up according to otherwise the same procedure as in Example 14. The substrate was set so that the above groove direction took an angle of 0°, 30°, 60° and 90° with respect to the dipping direction. Further, confronting electrodes were formed along the groove direction similarly as in Example 14, and photoconductivities were determined to obtain values of $10^{-11}$ to $10^{-10}$ S/cm in all of the samples. Thus, it has been made clear that at least $\sigma p$ becomes extremely great by the shape of the above substrate surface. Further, it has also been understood that coincidence of the substrate groove direction with the vertical movement direction during built-up is not necessarily the essential requirement.

EXAMPLE 26

The above dye (8) was dissolved in chloroform solvent and then spread on an aqueous phase adjusted to pH 6.2 with $KHCO_3$ with a $CdCl_2$ concentration of $4\times10^{-4}$ mol/liter and an aqueous phase temperature of 20° C. After evaporation of the solvent, the surface pressure was enhanced to 25 mN/m, and while maintaining this pressure constant, a polycarbonate substrate having V-shaped grooves with width of 1.6 μm and depth of 0.8 μm was dipped in the direction transversing the water surface at a speed of 3 mm/min. to form a monomolecular film on the substrate. Further, the substrate was gently moved up and down at a speed of 3 mm/min. to form built-up films of 2, 10, 20, 50, 100 and 200 layers of said monomolecular film. Further, similarly as in Example 14, confronting electrodes were set in the groove direction, and wavelength dependency (x=350-700 nm) characteristic of the photoconductivity was observed. There was also observed the wavelength dependency of photoconductivity for the sample with a monomolecular built-up film of the same dye as above formed on a smooth polycarbonate surface for comparison. As the result, the maximum of $\sigma p$ was near 590 nm in the both cases, but the spectrum was more abrupt for the substrate having grooves, with its absolute value being about 8-fold greater than that in smooth substrate. The dye molecule is known to form associated state having absorption near 590 nm, and the above increase of $\sigma p$ may be considered to be caused by increased number of such dye molecules associated, namely improvement of orientation, arrangement characteristic.

EXAMPLE 27

On a glass substrate, the photoresist material OMR (produced by Tokyo Oka Kogyo) was coated and dried to a film thickness of 1.5 μm.

Next, after exposure through a photomask having linear shadow portions with various thicknesses, development was performed to form grooves with respectively different groove intervals (groove width 1.6 μm, depth 1.5 μm, intervals between groove and groove being 1, 2, 5, 10, 20, 100 μm) were formed on the substrate. On the whole surface of this substrate, hydrophobic treatment was applied by building up 3 layers of the monomolecular film of cadmium arachidinate according to the LB method.

The above azulene dye (5) used in Example 14 was dissolved in benzene at a concentration of 1 mg/ml, and then spread on an aqueous phase, adjusted to pH 6.8 with $KHCO_3$, with a $CdCl_2$ concentration of $4\times10^{-4}$ mol/liter and an aqueous phase temperature of 17° C.

After evaporation of benzene (solvent), the surface pressure was enhanced to 20 mN/m to form a monomolecular film. While the surface pressure was maintained at a constant level (20 mN/m), the above substrate was dipped in the direction transversing the water surface gently at a speed of 3 mm/min., and then drawn up gently at a speed of 3 mm/min. to form two layers of the monomolecular film on the surface of the substrate. The above built-up operation was repeated 5 times to obtain an organic photoconductive medium of the present invention having 10 layers of the monomolecular film laminated on the substrate.

For the sample obtained as described above, photoconductivity $\sigma p$ was measured under irradiation of a ray (500-900 nm) monochromatized by a spectroscope, to obtain the result that it had the maximum to the incident light in the vicinity of 850 nm in the region with any groove width with its value being 10-11 to 10—10 S/cm. On the other hand, $\sigma p$ between the independent grooves was $10^{-14}$ S/cm or less over the whole wavelength region. Thus, it has been made clear that high photoconductive characteristics can be obtained by the above substrate surface shape and at the same time an extremely great anisotropic of photoconductivity can be obtained in the film interplanar directions of the photoconductive layer. That is, a photoconductive medium having a pattern according to the directionality of the uneven shape of the substrate was obtained. In this Example, linear grooves were employed, but curved grooves may be also used as a matter of course, provided that they have directionality.

COMPARATIVE EXAMPLE 8

In the example by use of a smooth glass substrate according entirely the same method as in the above Example 27, the photoconductivity between any desired two points was about $10^{-13}$ S/cm.

EXAMPLES 28-32, COMPARATIVE EXAMPLES 9-13

Except for making the built-up number of the monomolecular film in Example 27 as shown below in Table 5, various organic photoconductive media of the present invention and comparative examples were prepared in the same manner as in Example 27 and Comparative example 8, and photoconductivities were measured in the same manner as in Example 27 to obtain the results shown below in Table 5.

TABLE 5

| Example | Built-up number | Photoconductivity D | Photoconductivity E |
|---|---|---|---|
| 28 | 2 | $6 \times 10^{-12}$ | $5 \times 10^{-15}$ |
| 29 | 20 | $5 \times 10^{-11}$ | $1 \times 10^{-14}$ |
| 30 | 50 | $8 \times 10^{-11}$ | $3 \times 10^{-14}$ |
| 31 | 100 | $2 \times 10^{-10}$ | $3 \times 10^{-14}$ |
| 32 | 200 | $2 \times 10^{-10}$ | $3 \times 10^{-14}$ |

| Comparative example | Built-up number | Photoconductivity F |
|---|---|---|
| 9 | 2 | $7 \times 10^{-14}$ |
| 10 | 20 | $3 \times 10^{-13}$ |
| 11 | 50 | $4 \times 10^{-13}$ |
| 12 | 100 | $4 \times 10^{-13}$ |
| 13 | 200 | $4 \times 10^{-13}$ |

D photoconductivity (S/cm) of the region between two points along groove
E photoconductivity (S/cm) between two points across groove
F photoconductivity (S/cm) between any desired two points of comparative example

EXAMPLES 33-37

By use of the dyes shown below in Table 6 in place of the dye in Example 27, following otherwise the same procedure as in Example 27, various organic photoconductive media of the present invention were obtained. The photoconductivities of the respective different regions of these organic conductive media were measured similarly as in Example 27 to obtain the results as shown below in Table 6. In Examples 35, 36 and 37, for improvement of film forming property, a mixture of arachidinic acid ($C_{19}H_{39}COOH$) mixed at 1:3 relative to the dye molecule was used as the film constituting material. Further, in Example 37, a mixture of the dyes 9 and 10 at a molar ratio of 1:1 was used.

TABLE 6

| Example | Dye | Photoconductivity D | Photoconductivity E |
|---|---|---|---|
| 33 | (6) | $1 \times 10^{-10}$ | $5 \times 10^{-13}$ |
| 34 | (7) | $2 \times 10^{-8}$ | $3 \times 10^{-12}$ |
| 35 | (8) | $2 \times 10^{-11}$ | $8 \times 10^{-13}$ |
| 36 | (9) | $1 \times 10^{-12}$ | $4 \times 10^{-13}$ |
| 37 | (9) + (10) | $7 \times 10^{-12}$ | $6 \times 10^{-13}$ |

D, E have the same meanings as in Table 5.

EXAMPLE 38

On a glass substrate, the resist material OMR was coated (1.5 μm thickness), and stripe-shaped grooves (groove width 200 μm, width 1.6 μm, depth 1.5 μm) were formed by photoetching on the resist. By use of the substrate, 20 layers of the monomolecular film were built up according to otherwise the same procedure as in Example 27 to make a photoconductive medium of the present invention. Further, each one pair of externally connected electrodes confronted in the groove direction were formed on each continuous groove, and also one of the confronting electrodes was made the common electrode. The sample as obtained above was irradiated with a semiconductor laser (output 20 mw, beam diameter 20 μm) having the central wavelength at 870 nm an its conductivity σ was measured. As the result, when such irradiation was effected at any desired position between the electrodes to be measured, σ was about $10^{-10}$ S/cm, while when such ray irradiation was not effected at all or effected between the adjacent electrodes, σ was $10^{-14}$ S/cm or less. Thus, the above photoconductive medium comprises a large number of photoelectric converting elements according to desired shaped, and sufficient insulation is effected between the respective elements.

EXAMPLE 39

The above charge transfer complex was dissolved in a solvent mixture of benzene-acetonitrile (volume ratio 1:1) at a concentration of 1 mg/ml, and then spread on an aqueous phase adjusted to pH 6.8 with $KHCO_3$, with a $CdCl_2$ concentration of $4 \times 10^{-4}$ mol/liter and an aqueous phase temperature of 17° C.

After evaporation of the solvents of acetonitrile and benzen(mixed solvent), the surface pressure was enhanced to 20 dyne/cm to form a monomolecular film. While the surface pressure was maintained constant, by use of an intrinsic type (i-type) silicon wafer previously cut out in a rectangular shape as the substrate, the substrate was dipped about 20 mm in the direction transversing the water surface gently at a speed of 15 mm/min. and subsequently drawn up gently at a speed of 10 mm/min. to build up two layers of the monomolecular film. The above built-up operation was again repeated to prepare a built-up film of the monomolecular film on the substrate.

Further, according to the known method, by use of a conductive paint (silver paste) one pair of stripe-shaped externally connected electrodes 16 as shown in FIG. 5 were formed. The electrode width was set at 2 mm, the length 10 mm and the electrode distance 2 mm. Next, the sheet resistivity ρs was found to be 240 KΩ/cm² from measuring the current-voltage characteristic of the element under this state. Further, by use of the mask 15 made of a nickel permalloy, argon 14 of $1 \times 10^{16}$/cm2 was ion injected into the desired region of the film. The acceleration voltage at this time was set at 150 KeV, and the substrate temperature was set at room temperature. Since the interval mutually between the slits 12 of the mask 15 was set at 5 mm, the area of the region implanted with argon ions was ½ of the whole area sandwiched between the electrodes.

Further, ρs was found to be 490 kΩ/cm² from again measuring the current-voltage characteristic to be 490 KΩ/cm². This is approximately 2-fold of the value previously found, indicating that conductivity of the desired region (here ½ of the conductive path between electrodes) could be extinguished by ion injection.

EXAMPLE 40

According to entirely the same method as in Example 39, the monomolecular film of bis-tetracyanoquinodimethane docosyl pyridinium was prepared and stripe-shaped electrodes were formed thereon. At this time, from the current-voltage characteristic, ρs was found to be 240 KΩ/cm².

Next, a SiNH film was formed to a thickness of 10 nm by the glow discharge method so as to cover the portion of conductive path between the electrodes. Further, from above the film, argon ions at an acceleration voltage of 200 KeV were implanted at a dose of $5 \times 10^{16}$/cm² at room temperature. The implanted region was ½ of the conductive path region between the electrodes, and the same mask as in Example 39 was employed. Again, ρs of the sample as obtained above was found to be 460 KΩ/cm².

On the other hand, from analysis of secondary ions mass analysis for the sample, it was found that ion-beam-mixing occurred in the argon ion implanting region and the constituent atoms (Si, N, H) of the SiNH film were diffused into the monomolecular built-up film. Increase of ρs is due to diffusion of these impurities, and the extent of its increase (about 2-fold) can be said to be inversely proportional to the ratio of the ion-implanting region.

EXAMPLE 41

According to the method shown in Example 39, on an i-type silicon wafer was formed the monomolecular built-up film of 4 layers of bis-tetracyanoquinodimethane docosyl pyridinium. Further, with a square region (5×5 mm) being remained near the center of the sample, argon ions at an acceleration voltage of 150 keV were injected other regions at a dose of $1 \times 10_1{}^6$/cm².

Figure 6:
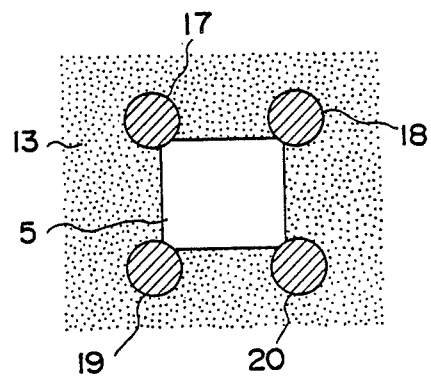

Further, as shown in FIG. 6, at the corners of the square uninjected region 17, electrodes 17–20 with diameters of 2–3 mm were formed according to the known method by use of silver paste. Next, between the two electrodes 17 and 18, a direct current voltage V was applied, and the current I passing between the remaining two electrodes 19 and 20 at this time was determined, and from this value $\rho s$ ($=\pi V/\ln 2 \cdot I$) was determined by the van der Pauw method to obtain a value of 230 K$\Omega$/cm$^2$.

The method of determining $\rho s$ and Hall constant by the van der Pauw method is very simple, and is well used for inorganic semiconductors, typically silicon.

This Example has realized easily the measuring method in organic thin film by applying injection of impurity as the method for processing the shape for the sample to be measured.

EXAMPLES 42-46

As shown below in Table 7, concerning several kinds of charge transfer complexes, similarly as in Example 39, the monomolecular films were built up on substrates, and the sheet resistivities before and after ion injection of impurity were measured. Those results are also shown in Table 7 (ratio of sheet resistivity before and after such injection is shown). Also, substrates and injection impurity species employed were different from those in Example 39 and hence also shown in Table 7. The acceleration voltage during ion injection was set at 100 KeV, and the injected amount was all $10^{14}$/cm$_2$. Table 7

EXAMPLE 42

Charge transfer complex: (11)
Injected impurity: O+
Substrate: polycarbonate
Sheet resistivity ratio: 2.0

EXAMPLE 43

Charge transfer complex: (11)
Injected impurity: F+
Substrate: PET film
Sheet resistivity ratio: 1.9

EXAMPLE 44

Charge transfer complex: (12)
Injected impurity: H+
Substrate: Si wafer
Sheet resistivity ratio: 1.4

EXAMPLE 45

Charge transfer complex: (12)
Injected impurity: Ar+
Substrate: Si wafer
Sheet resistivity ratio: 1.8

EXAMPLE 46

Charge transfer complex: (13)
Injected impurity: Ar+
Substrate: Si wafer
Sheet resistivity ratio: 2.0

(11)

(12)

-continued

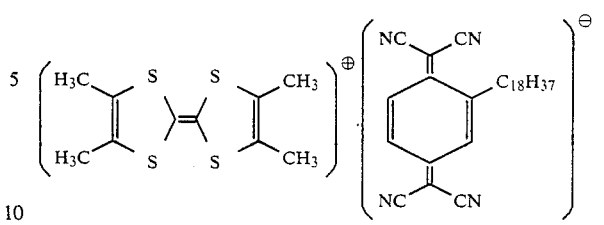

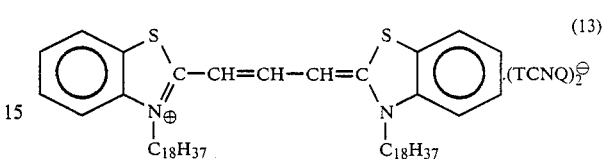
(13)

EXAMPLE 47

The above charge transfer complex was dissolved in a solvent mixture of benzene-acetonitrile (volume ratio 1:1) at a concentration of 1 mg/ml, and then spread on an aqueous phase, adjusted to pH 6.8 with KHCO$_3$, with a CdCl$_2$ concentration of $4\times 10^{-4}$ mol/liter and an aqueous phase temperature of 17° C.

After evaporation of acetonitrile and benzene(mixed solvent), the surface pressure was enhanced to 20 dyne/cm to form a monomolecular film. While the surface pressure was maintained constant, by use of a clean glass (30×10 mm) of which the surface is subjected to hydrophobic treatment (having 3 layers of cadmium arachidinate built up) as the substrate, the substrate was dipped about 20 mm in the direction transversing the water surface gently at a speed of 15 mm/min. and subsequently drawn up gently at a speed of 10 mm/min. to build up two layers of the monomolecular film. The above built-up operation was repeated 10 times to prepare a built-up film of the monomolecular film on the substrate.

Figure 8:
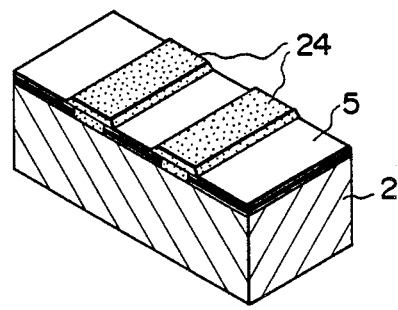
FIG. 8 shows the electrical element of Example.

Next, from above the built-up film, gold was vacuum vapor deposited (film thickness 200 nm) according to the resistance heating method to form a pair of confronting electrodes 24 (width 2 mm, length 10 mm, distance between electrodes 1 mm) as shown in FIG. 8. The distance between the vaporization source and the substrate was 10 cm, and the substrate temperature was set at room temperature.

For the device prepared according to the above method, the current-voltage characteristic between electrodes was measured, whereby it was found that a linear relationship can be recognized at least in the range of $0-\pm 1$ V, indicating that ohmic electrodes were formed. Also, from the slope of the straight line in the graph, conductivity in the interplanar direction was calculated to be 0.12 S/cm.

On the other hand, on the built-up film prepared according to entirely the same method as described above, gold was vacuum vapor deposited (film thickness about 200 nm, room temperature) by the resistance heating method with a distance of 40 cm from the vaporization source, a device as shown in FIG. 8 was formed similarly as described above. Further, the current-voltage characteristic between electrodes 24 was measured, but the material between the electrodes was deemed to be an insulator, because only a current of $1 \times 10^{-10}$ (noise level of the measuring system) flowed even on application of 20 V.

The reason for the result different from the previous case may be considered to be due to the fact that, in the former case, gold is diffused into the film during or immediately after vapor deposition to impart conductivity in the vertical direction of the film surface, whereby ohmic externally connected electrodes with the conductive region within the film surface were formed.

In this Example, the case of diffusing gold during vapor deposition is shown, but gold is not limitative, but any impurity with great diffusion constant can be used. However, the applicable material will be greatly influenced by the constituent moleculars of the built-up film or its structure, film material.

EXAMPLE 48

On the built-up film of the monomolecular films prepared on the substrate according to entirely the same method as in Example 47, gold was vacuum-vapor-deposited similarly as in Example 47 (speed 5 nm/s) to form a device as shown in FIG. 8 (the device constants, etc. are the same as in Example 47).

Further, this was set in a vacuum electric furnace (under $2 \times 10^{-3}$ torr), and subjected to heat treatment at 50° C. for 24 hours. Further, after left to stand to cool, the current-voltage characteristic between gold electrodes was measured to determine electroconductivity, which was 0.16 S/cm, improved in performance by 30% or more as compared with the case when no heat treatment was conducted, which was 0.12 S/cm. This may be considered to be due to promotion of gold diffusion by the heat treatment.

EXAMPLE 49

The same charge transfer complex as in Example 47 was dissolved in a solvent mixture of benzeneacetonitrile (volume ratio 1:1) at a concentration of 1 mg/ml, and then spread on an aqueous phase adjusted to pH 6.8 with $KHCO_3$, with a $CdCl_2$ concentration of $4 \times 10^{-4}$ mol/liter and an aqueous phase temperature of 17° C.

After evaporation of the mixed solvent of acetonitrile and benzene, the surface pressure was enhanced to 20 dyne/cm to form a monomolecular film. While the surface pressure was maintained constant, by use of an intrinsic (i-type) Si wafer previously cut out in a rectangular shape of 10×30 mm as the substrate, the substrate was dipped about 20 mm in the direction transversing the water surface gently at a speed of 15 mm/min. and subsequently drawn up gently at a speed of 10 mm/min. to build up two layers of monomolecular film. The above built-up operation was repeated once again to build up 4 layers of the monomolecular film on the substrate.

Of the two samples as prepared above, on one sample were effected ion injection of chromium (acceleration voltage 30 KeV) of $7 \times 10^{16}/cm^2$ over the two regions (each being of the size 2×2 mm) with an interval of 1 mm therebetween.

Further, aluminum vapor deposition (resistance heating method) was conducted on the sample as a pair of externally connected electrodes so as to cover the respective regions injected with ions. On the other sample, without application of ion injection after film formation, the above aluminum electrode formation was effected.

For the two samples as described above, 30 V was applied between the aluminum electrodes. As the result, in the sample in which no ion injection was effected, no current of noise level or higher ($10^{-10}$ A) was observed, but a current of $2 \times 10^{-8}$ A was observed to flow in the sample subjected to ion injection. From these facts, it has been made clear that conductivity in the direction vertical to the film surface was obtained by ion injection of chromium into the monomolecular built-up film having great anisotropic in conductivity.

EXAMPLES 50-53

Similarly as in Example 49, various monomolecular built-up films of charge transfer complex were prepared on the respective surfaces of several kinds of conductive substrates as shown below in Table 8, and impurity ions were injected at acceleration voltage of 20 KeV each in amount of $8 \times 10^{15}/cm^2$. Further, on such injected region, gold was vapor-deposited to a thickness of 150 nm by the resistance heating method, and voltage was applied between this as the upper electrode and the conductive substrate, and the conductivity in the film thickness direction was measured to obtain the result (E) shown below in Table 8.

On the other hand, conductivity was also measured similarly for the region in which no ion injection was effected for comparative purpose. The result (F) is also shown in Table 8.

The charge transfer complex corresponds to the same symbol as in Table 7.

TABLE 8

| Example 50 | |
|---|---|
| Charge transfer complex | (11) |
| Injected impurity | A l |
| Substrate | polycarbonate with Au vapor-deposited thereon |
| Conductivity (S/cm) | E $5 \times 10^{-2}$ |
| | F $10^{-7}$ |
| Example 51 | |
| Charge transfer complex | (11) |
| Injected impurity | Ag |
| Substrate | ITO substrate |
| Conductivity (S/cm) | E $8 \times 10^{-2}$ |
| | F $10^{-7}$ |
| Example 52 | |
| Charge transfer complex | (12) |
| Injected impurity | Au |
| Substrate | ITO substrate |
| Conductivity (S/cm) | E 7 |
| | F $3 \times 10^{-2}$ |
| Example 53 | |
| Charge transfer complex | (13) |
| Injected impurity | I |
| Substrate | ITO substrate |
| Conductivity (S/cm) | E $6 \times 10^{-2}$ |
| | F $5 \times 10^{-5}$ |

Conductivity E: the present invention (ion injection)
Conductivity F: comparative example (no ion injection)

What is claimed is:

1. An organic photoconductive medium, comprising a substrate having an uneven pattern and an organic photoconductive layer which exhibits an insulating property in the direction of a layer thickness and a photoconductive property in the direction of a layer plane and which is provided on the substrate, an anisotropic property being imparted to the photoconductive property of the photoconductive layer in the direction of a layer plane, wherein the photoconductive organic layer is the monomolecular film of a photoconductive organic compound having a hydrophobic site and a hydrophilic site in one molecule or a built-up film thereof.

2. An organic photoconductive medium according to claim 1, wherein the photoconductive organic compound is a photoconductive organic dye.

3. An organic photoconductive medium according to claim 2, wherein said photoconductive organic dye is a cyanine dye.

4. An organic photoconductive medium according to claim 2, wherein said photoconductive organic dye is a merocyanine dye.

5. An organic photoconductive medium according to claim 2, wherein said photoconductive organic dye is a phthalocyanine dye.

6. An organic photoconductive medium according to claim 2, wherein said photoconductive organic dye is a triphenylmethane dye.

7. An organic photoconductive medium according to claim 2, wherein said photoconductive organic dye is a azulene dye.

8. An organic photoconductive medium according to claim 1, wherein said fine uneven shape has any desired directionality.

9. An organic photoconductive medium according to claim 1, wherein said substrate comprises any material of metal, glass, ceramics and plastic.

10. An organic photoconductive medium according to claim 1, wherein said substrate having uneven shape is obtained by transfer with the use of a mold having the surface with a fine uneven shape.

11. An organic photoconductive medium according to claim 1, wherein said substrate having uneven shape is formed by photoetching.

12. An organic photoconductive medium according to claim 1, wherein said substrate having uneven shape is formed by exposure through a mask pattern and then developing.

13. An organic photoconductive medium according to claim 1, wherein the interval of unevenness, namely the pitch width is 0.1 to 100 $\mu$m.

14. An organic photoconductive medium according to claim 1, wherein the depth at the recess of said substrate is 0.1 to 100 $\mu$m.

15. An organic photoconductive medium, comprising a substrate having an uneven pattern and an organic photoconductive layer which exhibits an insulating property in the direction of a layer thickness and a photoconductive property in the direction of a layer plane and which is provided on the substrate, an anisotropic property being imparted, along the uneven direction of the substrate, to the photoconductive property of the photoconductive layer in the direction of a layer plane, wherein the photoconductive organic layer is the monomolecular film of a photoconductive organic compound having a hydrophobic site and a hydrophilic site in one molecule or a built-up film thereof.

16. An organic photoconductive medium according to claim 15, wherein the photoconductive organic compound is a photoconductive organic dye.

17. An organic photoconductive medium according to claim 16, wherein said photoconductive organic dye is a cyanine dye.

18. An organic photoconductive medium according to claim 16, wherein said photoconductive organic dye is a merocyanine dye.

19. An organic photoconductive medium according to claim 16, wherein said photoconductive organic dye is a phthalocyanine dye.

20. An organic photoconductive medium according to claim 16, wherein said photoconductive organic dye is a triphenylmethane dye.

21. An organic photoconductive medium according to claim 16, wherein said photoconductive organic dye is an azulene dye.

22. An organic photoconductive medium according to claim 15, wherein said fine uneven shape has any desired directionality.

23. An organic photoconductive medium according to claim 15, wherein said substrate comprises any material of metal, glass, ceramics and plastic.

24. An organic photoconductive medium according to claim 15, wherein said substrate having uneven shape is obtained by transfer with the use of a mold having the surface with a fine uneven shape.

25. An organic photoconductive medium according to claim 15, wherein said substrate having uneven shape is formed by photoetching.

26. An organic photoconductive medium according to claim 15, wherein said substrate having uneven shape is formed by exposure through a mask pattern and then developing.

27. An organic photoconductive medium according to claim 15, wherein the interval of unevenness, namely the pitch width is 0.1 to 100 $\mu$m.

28. An organic photoconductive medium according to claim 15, wherein the depth at the recess of said substrate is 0.1 to 100 $\mu$m.

29. An organic photoconductive medium, comprising a substrate having an uneven pattern and an organic photoconductive layer provided on the substrate, the photoconductive layer comprising a monomolecular film of an organic photoconductive compound having a hydrophilic portion and a hydrophobic portion or a built-up film thereof, an anisotropic property being imparted to the photoconductive property of the photoconductive layer in the direction of a layer plane.

30. An organic photoconductive medium according to claim 29, wherein the photoconductive organic layer is the monomolecular film of a photoconductive organic compound having a hydrophobic site and a hydrophilic site in one molecule or a built-up film thereof.

31. An organic photoconductive medium according to claim 30, wherein the photoconductive organic compound is a photoconductive organic dye.

32. An organic photoconductive medium according to claim 31, wherein said photoconductive organic dye is a cyanine dye.

33. An organic photoconductive medium according to claim 31, wherein said photoconductive organic dye is a merocyanine dye.

34. An organic photoconductive medium according to claim 31, wherein said photoconductive organic dye is a phthalocyanine dye.

35. An organic photoconductive medium according to claim 31, wherein said photoconductive organic dye is a triphenylmethane dye.

36. An organic photoconductive medium according to claim 31, wherein said photoconductive organic dye is an azulene dye.

37. An organic photoconductive medium according to claim 29, wherein said fine uneven shape has any desired directionality.

38. An organic photoconductive medium according to claim 29, wherein said substrate comprises any material of metal, glass, ceramics and plastic.

39. An organic photoconductive medium according to claim 29, wherein said substrate having uneven shape is obtained by transfer with the use of a mold having the surface with a fine uneven shape.

40. An organic photoconductive medium according to claim 29, wherein said substrate having uneven shape is formed by photoetching.

41. An organic photoconductive medium according to claim 29, wherein said substrate having uneven shape is formed by exposure through a mask pattern and then developing.

42. An organic photoconductive medium according to claim 29, wherein the interval of unevenness, namely the pitch width is 0.1 to 100 μm.

43. An organic photoconductive medium according to claim 29, wherein the depth at the recess of said substrate is 0.1 to 100 μm.

44. An organic photoconductive medium, comprising a substrate having an uneven pattern and an organic photoconductive layer provided on the substrate, the photoconductive layer comprising a monomolecular film of an organic photoconductive compound having a hydrophilic portion and a hydrophobic portion or a built-up film thereof, an anisotropic property being imparted, along the uneven direction of the substrate, to the photoconductive property of the photoconductive layer in the direction of a layer plane.

45. An organic photoconductive medium according to claim 44, wherein the photoconductive organic layer is the monomolecular film of a photoconductive organic compound having a hydrophobic site and a hydrophilic site in one molecule or a built-up film thereof.

46. An organic photoconductive medium according to claim 45, wherein the photoconductive organic compound is a photoconductive organic dye.

47. An organic photoconductive medium according to claim 46, wherein said photoconductive organic dye is a cyanine dye.

48. An organic photoconductive medium according to claim 46, wherein said photoconductive organic dye is a merocyanine dye.

49. An organic photoconductive medium according to claim 46, wherein said photoconductive organic dye is a phthalocyanine dye.

50. An organic photoconductive medium according to claim 46, wherein said photoconductive organic dye is a triphenylmethane dye.

51. An organic photoconductive medium according to claim 46, wherein said photoconductive organic dye is a azulene dye.

52. An organic photoconductive medium according to claim 44, wherein said fine uneven shape has any desired directionality.

53. An organic photoconductive medium according to claim 44, wherein said substrate comprises any material of metal, glass, ceramics and plastic.

54. An organic photoconductive medium according to claim 44, wherein said substrate having uneven shape is obtained by transfer with the use of a mold having the surface with a fine uneven shape.

55. An organic photoconductive medium according to claim 44, wherein said substrate having uneven shape is formed by photoetching.

56. An organic photoconductive medium according to claim 44, wherein said substrate having uneven shape is formed by exposure through a mask pattern and then developing.

57. An organic photoconductive medium according to claim 44, wherein the inverval of unevenness, namely the pitch width is 0.1 to 100 μm.

58. An organic photoconductive medium according to claim 44, wherein the depth at the recess of said substrate is 0.1 to 100 μm.

* * * * *

UNITED STATES PATENT AND TRADEMARK OFFICE
CERTIFICATE OF CORRECTION

PATENT NO. : 4,929,524

DATED : May 29, 1990

INVENTOR(S) : KUNIHIRO SAKAI, ET AL.                    Page 1 of 2

It is certified that error appears in the above-identified patent and that said Letters Patent is hereby corrected as shown below:

ON THE TITLE PAGE, IN THE TITLE, ITEM [54]

"PHOTO CONDUCTIVE" should read --PHOTOCONDUCTIVE--.

COLUMN 1

Line 1, "PHOTO CONDUCTIVE" should read --PHOTOCONDUCTIVE--.
Line 25, "art inorganic" should read --art. Inorganic--.
Lines 41 and 42, "Lang-muir-Bloddget" should read --Langmuir-Bloddget--.

COLUMN 2

Line 56, "insulting" should read --insulating--.

COLUMN 7

Line 60, "havinga" should read --having a--.

COLUMN 8

Line 7, "Botzmann's" should read --Boltzmann's--.
Line 9, "interations" should read --interactions--.

COLUMN 11

Line 15, "are" should be deleted.

COLUMN 14

Line 22, "have" should read --had--.

UNITED STATES PATENT AND TRADEMARK OFFICE
CERTIFICATE OF CORRECTION

PATENT NO. : 4,929,524
DATED : May 29, 1990
INVENTOR(S) : KUNIHIRO SAKAI, ET AL.

It is certified that error appears in the above-identified patent and that said Letters Patent is hereby corrected as shown below:

COLUMN 19

Line 36, "an" should read --and--.
Line 44, "shaped," should read --shapes--.
Line 61, "benzen(mixed solvent)," should read --benzene (mixed solvent),--.

COLUMN 24

TABLE 8, "E 5 X 10$_-^2$" should read --E 5 X $10^{-2}$--.
TABLE 8, "E 8 X 10$_-^2$" should read --E 8 X $10^{-2}$--.
TABLE 8, "E 6 X 10$_-^2$" should read --E 6 X $10^{-2}$--.

COLUMN 28

Line 34, "inverval" should read --interval--.

Signed and Sealed this

Fifteenth Day of October, 1991

Attest:

HARRY F. MANBECK, JR.

*Attesting Officer*   *Commissioner of Patents and Trademarks*